(12) United States Patent
Park et al.

(10) Patent No.: US 11,407,943 B2
(45) Date of Patent: *Aug. 9, 2022

(54) ETCHING COMPOSITION FOR THIN FILM CONTAINING SILVER, METHOD FOR FORMING PATTERN AND METHOD FOR MANUFACTURING A DISPLAY DEVICE USING THE SAME

(71) Applicant: SAMSUNG DISPLAY CO., LTD., Yongin-si (KR)

(72) Inventors: Jonghee Park, Yongin-si (KR); Kitae Kim, Yongin-si (KR); Jinseock Kim, Yongin-si (KR); Gyu-Po Kim, Yongin-si (KR); Hyun-Cheol Shin, Yongin-si (KR); Dae-Woo Lee, Yongin-si (KR); Sang-Hyuk Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/575,593

(22) Filed: Sep. 19, 2019

(65) Prior Publication Data
US 2020/0148950 A1 May 14, 2020

(30) Foreign Application Priority Data
Nov. 12, 2018 (KR) .......................... 10-2018-0138164

(51) Int. Cl.
*C09K 13/06* (2006.01)
*C23F 1/16* (2006.01)

(52) U.S. Cl.
CPC .................................... *C09K 13/06* (2013.01)

(58) Field of Classification Search
None
See application file for complete search history.

(56) References Cited

U.S. PATENT DOCUMENTS

| | | | |
|---|---|---|---|
| 9,845,538 B2 | 12/2017 | Yokomizo et al. | |
| 10,611,962 B2* | 4/2020 | Park | .......................... C04B 41/91 |
| 11,091,694 B2* | 8/2021 | Park | .......................... C23F 1/30 |
| 2008/0277381 A1* | 11/2008 | Chung | ........................ C23F 1/14 |
| | | | 216/94 |
| 2010/0170696 A1* | 7/2010 | Yano | .................... C03C 17/3644 |
| | | | 174/126.2 |

(Continued)

FOREIGN PATENT DOCUMENTS

| | | |
|---|---|---|
| CN | 106011861 | 10/2016 |
| KR | 10-1346976 B1 | 12/2013 |

(Continued)

OTHER PUBLICATIONS

Chinese Office Action for Chinese Patent Application or Patent No. 201911085578.0, dated Dec. 2, 2021.

*Primary Examiner* — Shamim Ahmed
(74) *Attorney, Agent, or Firm* — Kile Park Reed & Houtteman PLLC

(57) ABSTRACT

An etching composition for a silver-containing thin film includes an inorganic acid compound, a carboxylic acid compound, a sulfonic acid compound, a glycol compound, a nitrogen-containing dicarbonyl compound, a metal-based oxidizer, and water.

17 Claims, 12 Drawing Sheets

(56) References Cited

U.S. PATENT DOCUMENTS

| | | | | |
|---|---|---|---|---|
| 2012/0187087 | A1* | 7/2012 | Ohshiro | C23F 1/18 |
| | | | | 216/95 |
| 2014/0038348 | A1* | 2/2014 | Kim | H01L 21/465 |
| | | | | 438/99 |
| 2014/0295626 | A1* | 10/2014 | Park | H01L 27/1259 |
| | | | | 438/151 |
| 2015/0162213 | A1* | 6/2015 | Chen | C23F 1/28 |
| | | | | 438/754 |
| 2016/0185595 | A1* | 6/2016 | Chen | B81C 1/00539 |
| | | | | 216/13 |
| 2016/0244639 | A1* | 8/2016 | Li | C09K 3/1463 |
| 2016/0348001 | A1* | 12/2016 | Shigeta | H01L 33/36 |
| 2017/0015903 | A1* | 1/2017 | Wang | C09K 13/00 |
| 2018/0148645 | A1* | 5/2018 | Lee | C09K 13/06 |
| 2018/0239256 | A1* | 8/2018 | Choi | C11D 3/0073 |
| 2018/0298500 | A1* | 10/2018 | Takahashi | C23F 1/18 |
| 2020/0148951 | A1* | 5/2020 | Park | H01L 27/32 |

FOREIGN PATENT DOCUMENTS

| | | |
|---|---|---|
| KR | 10-1391603 B1 | 4/2014 |
| KR | 10-2014-0108795 A | 9/2014 |
| KR | 10-2014-0118491 A | 10/2014 |
| KR | 10-2016-0025081 A | 3/2016 |
| KR | 10-2016-0090575 A | 8/2016 |

* cited by examiner

ETCHING COMPOSITION FOR THIN FILM CONTAINING SILVER, METHOD FOR FORMING PATTERN AND METHOD FOR MANUFACTURING A DISPLAY DEVICE USING THE SAME

CROSS-REFERENCE TO RELATED APPLICATION

Korean Patent Application No. 10-2018-0138164, filed on Nov. 12, 2018, in the Korean Intellectual Property Office, and entitled: "Etching Composition for Thin Film Containing Silver, Method for Forming Pattern and Method for Manufacturing a Display Device Using the Same," is incorporated by reference herein in its entirety.

BACKGROUND

1. Field

Exemplary embodiments relate to an etching composition. Exemplary embodiments relate to an etching composition for a silver-containing thin film, a method for forming a pattern and a method for manufacturing a display device using the etching composition.

2. Description of the Related Art

An organic light-emitting display device emits light. Organic light-emitting display devices have a reduced weight and thickness and have characteristics appropriate for a flexible display device. Usage of organic light-emitting display devices has increased.

SUMMARY

Embodiments are directed to an etching composition for a silver-containing thin film, the etching composition including an inorganic acid compound, a carboxylic acid compound, a sulfonic acid compound, a glycol compound, a nitrogen-containing dicarbonyl compound, a metal-based oxidizer, and water.

The inorganic acid compound may include at least one selected from nitric acid ($HNO_3$), sulfuric acid ($H_2SO_4$) and hydrochloric acid (HCl).

The carboxylic acid compound may include at least one selected from acetic acid, ($CH_3CO_2H$), malic acid ($C_4H_6O_5$), citric acid ($C_6H_8O_7$), tartaric acid ($C_4H_6O_6$), lactic acid ($C_3H_6O_3$), formic acid ($CH_2O_2$), succinic acid ($C_4H_6O_4$) and fumaric acid ($C_4H_4O_4$).

The sulfonic acid compound may include at least one selected from methanesulfonic acid ($CH_3SO_3H$), p-toluenesulfonic acid ($CH_3C_6H_4SO_3H$), benzenesulfonic acid ($C_6H_5SO_3H$), amino methylsulfonic acid ($CH_5NO_3S$) and sulfamic acid ($H_3NSO_3$).

The glycol compound may include at least one selected from diethylene glycol ($C_4H_{10}O_3$), ethylene glycol ($HOCH_2CH_2OH$), glycolic acid ($CH_2OHCOOH$), propylene glycol ($C_3H_9O_2$) and triethylene glycol ($C_6H_{14}O_4$).

The nitrogen-containing dicarbonyl compound may include at least one selected from iminodiacetic acid ($C_4H_7NO_4$), imidazolidine-2,4-dione ($C_3H_4N_2O_2$), succinimide ($C_4H_5NO_2$), glutarimide ($C_5H_7NO_2$), glycine ($C_2H_5NO_2$), asparagine ($C_4H_5N_2O_3$), glutamic acid ($C_5H_9NO_4$), aspartic acid ($C_4H_7NO_4$), pyro-glutamic acid ($C_5H_7NO_3$) and hippuric acid ($C_9H_9NO_3$).

The metal-based oxidizer may include at least one selected from copper sulfate ($CuSO_4$), copper nitrate ($Cu(NO_3)_2$), ferric nitrate ($Fe(NO_3)_3$), ferric sulfate ($Fe_2(SO_4)_3$), magnesium nitrate ($Mg(NO_3)_2$) and magnesium sulfate ($MgSO_4$).

The etching composition may include 8.1 wt % to 9.9 wt % of the inorganic acid compound, 40 wt % to 50 wt % of the carboxylic acid compound, 1 wt % to 4.9 wt % of the sulfonic acid compound, 10 wt % to 20 wt % of the glycol compound, 2 wt % to 10 wt % of the nitrogen-containing dicarbonyl compound, 0.1 wt % to 2 wt % of the metal-based oxidizer, and the remainder of water.

The inorganic acid compound includes nitric acid, the carboxylic acid compound may include acetic acid and citric acid, the sulfonic acid compound may include methanesulfonic acid, the glycol compound may include glycolic acid, the nitrogen-containing dicarbonyl compound may include imidazolidine-2,4-dione and pyro-glutamic acid, and the metal-based oxidizer may include iron nitrate.

The nitrogen-containing dicarbonyl compound may include imidazolidine-2,4-dione and pyro-glutamic acid with a weight ratio of 1:1.

Embodiments are also directed to a method for forming a pattern, the method including forming a multiple layer including a silver-containing thin film and a metal oxide thin film, etching the metal oxide thin film using a first etching composition; and etching the silver-containing thin film using a second etching composition, the second etching composition including an inorganic acid compound, a carboxylic acid compound, a sulfonic acid compound, a glycol compound, a nitrogen-containing dicarbonyl compound, a metal-based oxidizer, and water.

The second etching composition may include 8.1 wt % to 9.9 wt % of the inorganic acid compound, 40 wt % to 50 wt % of the carboxylic acid compound, 1 wt % to 4.9 wt % of the sulfonic acid compound, 10 wt % to 20 wt % of the glycol compound, 2 wt % to 10 wt % of the nitrogen-containing dicarbonyl compound, 0.1 wt % to 2 wt % of the metal-based oxidizer, and the remainder of water.

The inorganic acid compound includes nitric acid, the carboxylic acid compound includes acetic acid and citric acid, the sulfonic acid compound includes methanesulfonic acid, the glycol compound includes glycolic acid, the nitrogen-containing dicarbonyl compound includes imidazolidine-2,4-dione and pyro-glutamic acid, and the metal-based oxidizer includes iron nitrate.

The first etching composition may include nitric acid, sulfuric acid, an ammonium compound, a cyclic amine compound and water.

Embodiments are also directed to a method for manufacturing a display device, including forming an active pattern on a base substrate in a display area; forming a gate metal pattern including a gate electrode overlapping the active pattern; forming a source metal pattern including a connection pad, the connection pad being in a peripheral area surrounding the display area; forming a multiple layer structure on the source metal pattern, the multiple layer structure including a lower layer including a metal oxide, an intermediate layer on the lower layer, the intermediate layer including silver or a silver alloy, and an upper layer on the intermediate layer. the upper layer including a metal oxide; etching the upper layer using a first etching composition; etching the intermediate layer using a second etching composition comprising an inorganic acid compound, a carboxylic acid compound, a sulfonic acid compound, a glycol compound, a nitrogen-containing dicarbonyl compound, a metal-based oxidizer, and water; and etching the lower layer using a third etching composition to form an electrode pattern in the display area and to expose the connection pad.

The source metal pattern may have a single-layer structure or a multiple-layer structure and may include aluminum.

The metal oxide may include at least one selected from indium oxide, zinc oxide, tin oxide, indium tin oxide and indium zinc oxide.

The second etching composition may include 8.1 wt % to 9.9 wt % of the inorganic acid compound, 40 wt % to 50 wt % of the carboxylic acid compound, 1 wt % to 4.9 wt % of the sulfonic acid compound, 10 wt % to 20 wt % of the glycol compound, 2 wt % to 10 wt % of the nitrogen-containing dicarbonyl compound, 0.1 wt % to 2 wt % of the metal-based oxidizer, and the remainder of water.

The source metal pattern may further include a source electrode and a drain electrode, which respectively contact the active pattern.

The method may further include connecting a driving chip that generates a driving signal to the connection pad.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
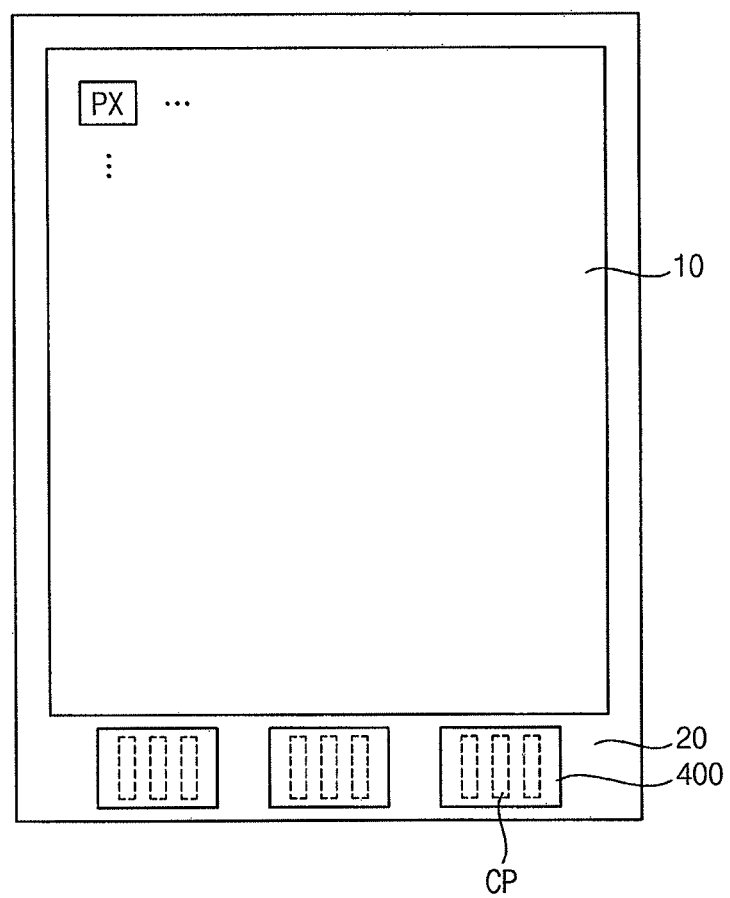
FIG. 1 illustrates a plan view of a display device manufactured according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

An etching composition for a silver-containing thin film, a method for forming a pattern and a method for manufacturing a display device according to exemplary embodiments will be described hereinafter with reference to the accompanying drawings, in which some exemplary embodiments are shown. Same or similar reference numerals may be used for same or similar elements in the drawings.

An etching composition for a silver-containing thin film

An etching composition according to an exemplary embodiment may include an inorganic acid compound, a carboxylic acid compound, a sulfonic acid compound, a glycol compound, a nitrogen-containing dicarbonyl compound, a metal-based oxidizer, and water. The etching composition may be used for etching a silver-containing thin film, for example, a thin film that contains silver or a silver alloy.

The inorganic acid compound may function as a main oxidizer for a silver component. The inorganic acid compound may decompose by reacting with silver in an etching process.

In an exemplary embodiment, the content of the inorganic acid compound may be 8.1 wt % to 9.9 wt %, or, for example, 8.5 wt % to 9.5 wt %. When the content of the inorganic acid compound is less than 9.9 wt %, the etching rate and etching degree may be controllable, and over-etching of the target thin film may be avoided. When the content of the inorganic acid compound is greater than 8.1 wt %, the etching rate may be sufficient so that etching for the silver-containing thin film may be sufficiently performed.

Examples of the inorganic acid compound may include nitric acid ($HNO_3$), sulfuric acid ($H_2SO_4$), hydrochloric acid (HCl), or the like. These may be used each alone or in combination thereof.

The carboxylic acid compound may function as a co-oxidizer for the silver component. The carboxylic acid compound may decrease the decomposition rate of the inorganic acid compound so that the etching rate of the silver-containing thin film may be kept constant.

In an exemplary embodiment, the content of the carboxylic acid compound may be 40 wt % to 50 wt %, or, for example, 42 wt % to 48 wt %. When the content of the carboxylic acid compound is less than 50 wt %, an excessive increase of the etching rate of the silver-containing thin film, which could cause erosion defects, may be avoided. When the content of the carboxylic acid compound is greater than 40 wt %, an increase in the decomposition rate of the inorganic acid compound, deterioration of the stability of the etching composition, and generation of an etching residue may be avoided.

Examples of the carboxylic acid compound may include acetic acid, ($CH_3CO_2H$), malic acid ($C_4H_6O_5$), citric acid ($C_6H_8O_7$), tartaric acid ($C_4H_6O_6$), lactic acid ($C_3H_6O_3$), formic acid ($CH_2O_2$), succinic acid ($C_4H_6O_4$), fumaric acid ($C_4H_4O_4$), or the like. These may be used each alone or in combination thereof.

In an exemplary embodiment, the carboxylic acid compound may include at least two substances. For example, the carboxylic acid compounds may include acetic acid and citric acid. Acetic acid has excellent performance as a co-oxidizer, but has a high volatility. In an exemplary embodiment, addition of citric acid may relatively reduce the content of acetic acid to improve the stability of the etching composition. In addition, citric acid has a chelating effect on silver ions. Accordingly, reductive precipitation of silver ions may be prevented. The etching composition may include 20 wt % to 25 wt % of acetic acid and 20 wt % to 25 wt % of citric acid.

The sulfonic acid compound may function as a co-oxidizer for the silver component. The sulfonic acid compound may increase the etching rate and may prevent etching residue. In addition, the sulfonic acid compound may decrease the decomposition rate of the inorganic acid compound so that the etching rate of the silver-containing thin film may be kept constant.

In an exemplary embodiment, the content of the sulfonic acid compound may be 1 wt % to 4.9 wt %, or, for example, 2 wt % to 4.9 wt %. When the content of the sulfonic acid compound is less than 4.9 wt %, an excessive increase in the etching rate of the silver-containing thin film, which could cause corrosion defects, may be avoided. When the content of the sulfonic acid compound is greater than 1 wt %, the decomposition rate of the inorganic acid compound may be decreased. Thus, instability of the etching composition and generation of etching residue may be avoided.

Examples of the sulfonic acid compound may include methanesulfonic acid ($CH_3SO_3H$), p-toluenesulfonic acid ($CH_3C_6H_4SO_3H$), benzenesulfonic acid ($C_6H_5SO_3H$), amino methylsulfonic acid ($CH_5NO_3S$), sulfamic acid ($H_3NSO_3$), or the like. These may be used each alone or in combination thereof.

The glycol compound may function as a co-oxidizer for the silver component and may serve as a solvent for activating the organic acid compound having a solid phase.

In an exemplary embodiment, the content of the glycol compound may be 10 wt % to 20 wt %, or, for example, 12 wt % to 20 wt %. When the content of the glycol compound is less than 20 wt %, an excessive increase of the etching rate of the silver-containing thin film, which could cause erosion defects, may be avoided. When the content of the glycol compound is greater than 10 wt %, activation of the inorganic acid compound may be facilitated, and generation of an etching residue may be avoided.

Examples of the glycol compound may include diethylene glycol ($C_4H_{10}O_3$), ethylene glycol ($HOCH_2CH_2OH$), glycolic acid ($CH_2OHCOOH$), propylene glycol ($C_3H_9O_2$), triethylene glycol ($C_6H_{14}O_4$), or the like. These may be used each alone or in combination thereof.

The nitrogen-containing dicarbonyl compound may control etching of the silver-containing thin film. For example, the nitrogen-containing dicarbonyl compound may effectively form a complex with a metal component to prevent excessive increase of cut-dimension (CD) skew. Thus, CD-skew may be maintained with respect to a content change of silver. Thus, the stability of the etching composition for cumulative use may be improved.

When other metal layers including an aluminum thin film and a titanium thin film are exposed in the etching process using the etching composition, damage of the aluminum may be prevented. Thus, reductive precipitation of silver due to aluminum damage and titanium tip may be suppressed.

In an exemplary embodiment, the content of the nitrogen-containing dicarbonyl compound may be 2 wt % to 10 wt %, or, for example, 3 wt % to 9 wt %. When the content of the nitrogen-containing dicarboxylic carbonyl compound is less than 10 wt %, an excessive reduction of the etching rate may be avoided. Thus, CD-skew may be formed, and the generation of etching residues may be avoided. When the content of the nitrogen-containing dicarbonyl compound is greater than 2 wt %, an excessive formation of CD-skew may be avoided, and a deterioration of the quality of the etching composition when silver ions increase, may be avoided.

Examples of the nitrogen-containing dicarbonyl compound may include iminodiacetic acid ($C_4H_7NO_4$), imidazolidine-2,4-dione ($C_3H_4N_2O_2$), succinimide ($C_4H_5NO_2$), glutarimide ($C_5H_7NO_2$), glycine ($C_2H_5NO_2$), asparagine ($C_4H_5N_2O_3$), glutamic acid ($C_5H_9NO_4$), aspartic acid ($C_4H_7NO_4$), pyro-glutamic acid ($C_5H_7NO_3$), hippuric acid ($C_9H_9NO_3$), or the like. These may be used alone or in combination thereof.

In an exemplary embodiment, the nitrogen-containing dicarbonyl compound may include at least two substances. For example, the nitrogen-containing dicarbonyl compound may include imidazolidin-2,4-dione and pyro-glutamic acid. Imidazolidin-2,4-dione may have an etch-stop effect to prevent excessive CD-skew and may have a chelating effect on silver. Pyro-glutamic acid may protect aluminum thereby suppressing reductive precipitation of silver and titanium tip. The weight ratio of imidazolidin-2,4-dione and pyro-glutamic acid may be, for example, 1:1.

The metal-based oxidizer may increase the etching rate for the silver component. In an exemplary embodiment, the content of the metal-based oxidizer may be 0.1 wt % to 2 wt %, or, for example, 0.2 wt % to 1.8 wt %. When the content of the metal-based oxidizer is less than 2 wt %, an excessive increase in the etching rate of the silver-containing thin film and an excessive increase of the CD-skew may be avoided. When the content of the metal-based oxidizer is greater than 0.1 wt %, the etching rate of the silver-containing thin film may be sufficient to avoid causing an etching residue.

Examples of the metal-based oxidizer may include copper sulfate ($CuSO_4$), copper nitrate ($Cu(NO_3)_2$), ferric nitrate ($Fe(NO_3)_3$), ferric sulfate ($Fe_2(SO_4)_3$), magnesium nitrate ($Mg(NO_3)_2$), magnesium sulfate ($MgSO_4$), ornd the like. These may be used alone or in combination thereof.

The content of water may correspond to the remainder in the etching composition excluding the contents of the inorganic acid compound, the carboxylic acid compound, the sulfonic acid compound, the glycol compound, the nitrogen-containing dicarbonyl compound and the metal-based oxidizer. As an example, ultrapure water or water having grade for manufacturing a semiconductor may be used.

The etching composition may be substantially free of phosphoric acid, which can cause damage to metals such as aluminum, instead of protecting such metals. In addition, phosphoric acid could increase a reductive precipitation of silver, thereby increasing manufacturing defects.

In addition, phosphoric acid could etch metal oxides such as indium tin oxide. Accordingly, the etching composition may exclude using phosphoric acid to selectively etch silver in a multiple-layer structure that includes a metal oxide such as indium tin oxide.

In an exemplary embodiment, the etching composition may include nitric acid, acetic acid, citric acid, methanesulfonic acid, glycolic acid, imidazolidin-2,4-dione, pyro-glutamic acid, iron nitrate, and the remainder of water.

The etching composition may be used for selectively etching a thin film containing silver or a silver alloy. For example, the etching composition may be used for selective etching the silver-containing thin film when etching a multiple-layer structure that includes the silver-containing thin film.

For example, the multiple-layer structure may include a lower layer including a metal oxide, an intermediate layer disposed on the lower layer and including silver or a silver alloy, and an upper layer disposed on the intermediate layer and including a metal oxide. For example, the metal oxide of the upper and lower layers may include indium oxide, zinc oxide, tin oxide, indium tin oxide, indium zinc oxide, zinc tin oxide, or the like.

The etching composition may prevent excessive increase of CD-skew and the generation of etching residue. The etching composition may prevent the generation of silver particles due to a reduction of silver ions. Therefore, manufacturing defects may be prevented and/or minimized.

Method for Manufacturing a Display Device

FIG. 1 illustrates a plan view of a display device manufactured according to an exemplary embodiment. FIGS. 2 to 11 are cross-sectional views illustrating stags of a method for manufacturing a display device according to an exemplary embodiment. FIG. 12 illustrates a cross-sectional view of a display device manufactured according to an exemplary embodiment.

Referring to FIG. 1, a display device 100 may include a display area 10 and a peripheral area 20 surrounding the display area 10.

Connection pads CP electrically connected to an external device may be disposed in the peripheral area 20. For example, the connection pads CP may be connected to a driving chip 400 providing a driving signal such as a data signal, a gate signal or the like. The driving signal provided by the driving chip 400 may be transferred to pixels PX in the display area 10 through the connection pads CP.

In an exemplary embodiment, the display device 100 may be an organic light-emitting display device. For example, an array of the pixels PX may be disposed in the display area 10. Each of the pixels PX may include an organic light-emitting diode and a circuit part for driving the organic light-emitting diode.

Figure 2:
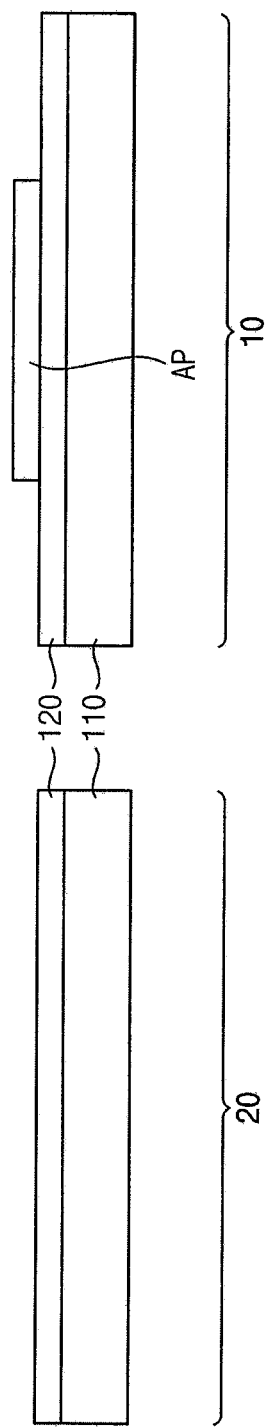
FIGS. 2 to 11 illustrate cross-sectional views of stages of a method for manufacturing a display device according to an exemplary embodiment.

Referring to FIG. 2, a buffer layer 120 may be formed on a base substrate 110.

The base substrate 110 may include, for example, glass, quartz, silicon, a polymer or the like. The polymer may include, for example, polyethylene terephthalate, polyethylene naphthalate, polyether ketone, polycarbonate, polyarylate, polyether sulfone, polyimide or a combination thereof.

The buffer layer 120 may prevent or reduce penetration of impurities, humidity or external gas from underneath of the base substrate 110, The buffer layer 120 may planarize an upper surface of the base substrate 110. The buffer layer 120 may include, for example, an inorganic material such as oxide, nitride or the like.

An active pattern AP may be formed on the buffer layer 120 in the display area 10.

The active pattern AP may include, for example, a semiconductive material such as amorphous silicon, polycrystalline silicon (polysilicon), a metal oxide or the like. In an exemplary embodiment, the active pattern AP may include polysilicon. At least a portion of the active pattern AP including polysilicon may be doped with impurities such as n-type impurities or p-type impurities.

Figure 3:
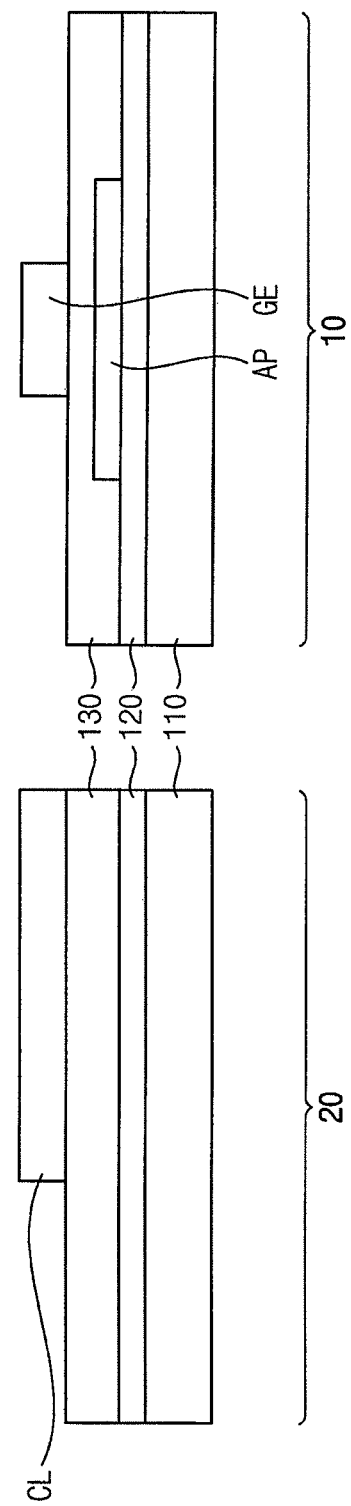

Referring to FIG. 3, a first insulation layer 130 may be formed on the active pattern AP. The first insulation layer 130 may include, for example, silicon oxide, silicon nitride, silicon carbide or a combination thereof. The first insulation layer 130 may include an insulating metal oxide such as aluminum oxide, tantalum oxide, hafnium oxide, zirconium oxide, titanium oxide or the like. The first insulation layer 130 may have a single-layer structure or a multiple-layer structure including silicon nitride and/or silicon oxide.

A gate metal pattern including a gate electrode GE and a connection line CL may be formed on the insulation layer 130.

The gate metal pattern may include, for example, gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof. The gate metal pattern may have a single-layer structure or a multiple-layer structure including different metal layers.

The connection line CL may be disposed in the peripheral area 20 and may extend into the display area 10.

After the gate electrode GE is formed, a portion of the active pattern AP may be doped with impurities through an ion-implantation process.

Figure 4:
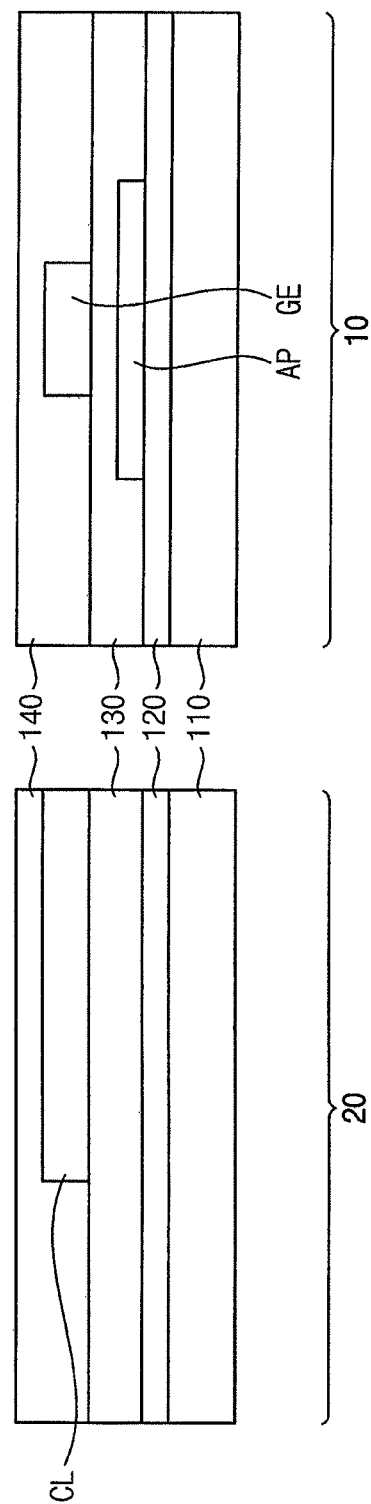

Referring to FIG. 4, a second insulation layer 140 may be formed to cover the gate metal pattern and the first insulation layer 130.

The second insulation layer 140 may include, for example, silicon oxide, silicon nitride, silicon carbide or a combination thereof. The second insulation layer 140 may include an insulating metal oxide such as aluminum oxide, tantalum oxide, hafnium oxide, zirconium oxide, titanium oxide or the like. The second insulation layer 140 have a single-layer structure or a multiple-layer structure including silicon nitride and/or silicon oxide.

Figure 5:
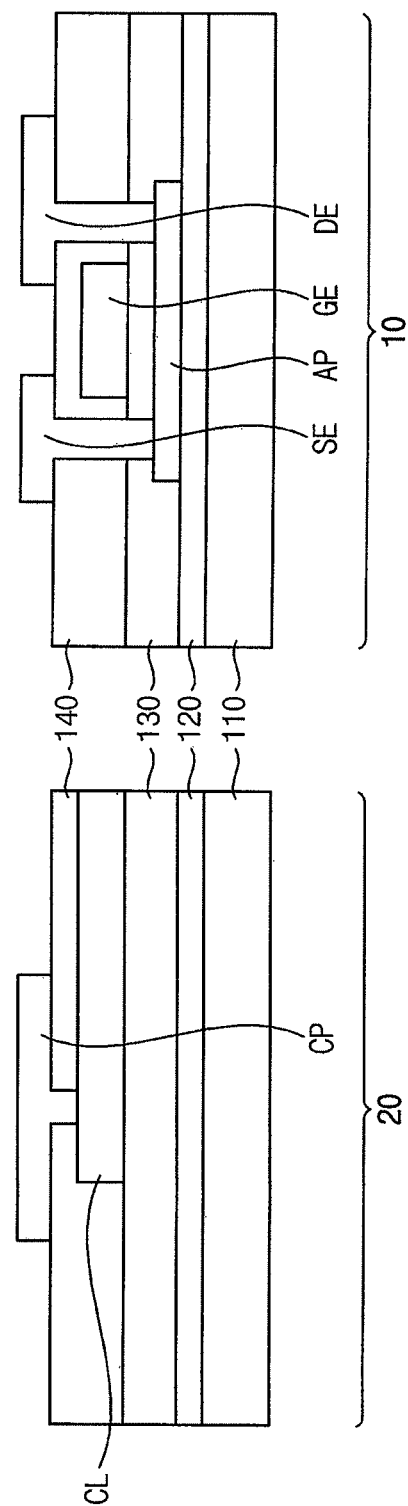

Referring to FIG. 5, a source metal pattern including a source electrode SE, a drain electrode DE and a connection pad CP may be formed on the second insulation layer 140.

The source electrode SE and the drain electrode DE may respectively pass through the first and second insulation layers 130 and 140 to contact the active pattern AP.

The connection pad CP may be disposed in the peripheral area 20 The connection pad CP may pass through the second insulation layer 140 to contact the connection line CL.

The source metal pattern may include, for example, gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof. The source metal pattern may have a single-layer structure or a multiple-layer structure including different metal layers. In an exemplary embodiment, the source metal pattern may include aluminum. For example, the source metal pattern may have a double-layer structure of titanium/aluminum or a triple-layer structure of titanium/aluminum/titanium.

Figure 6:
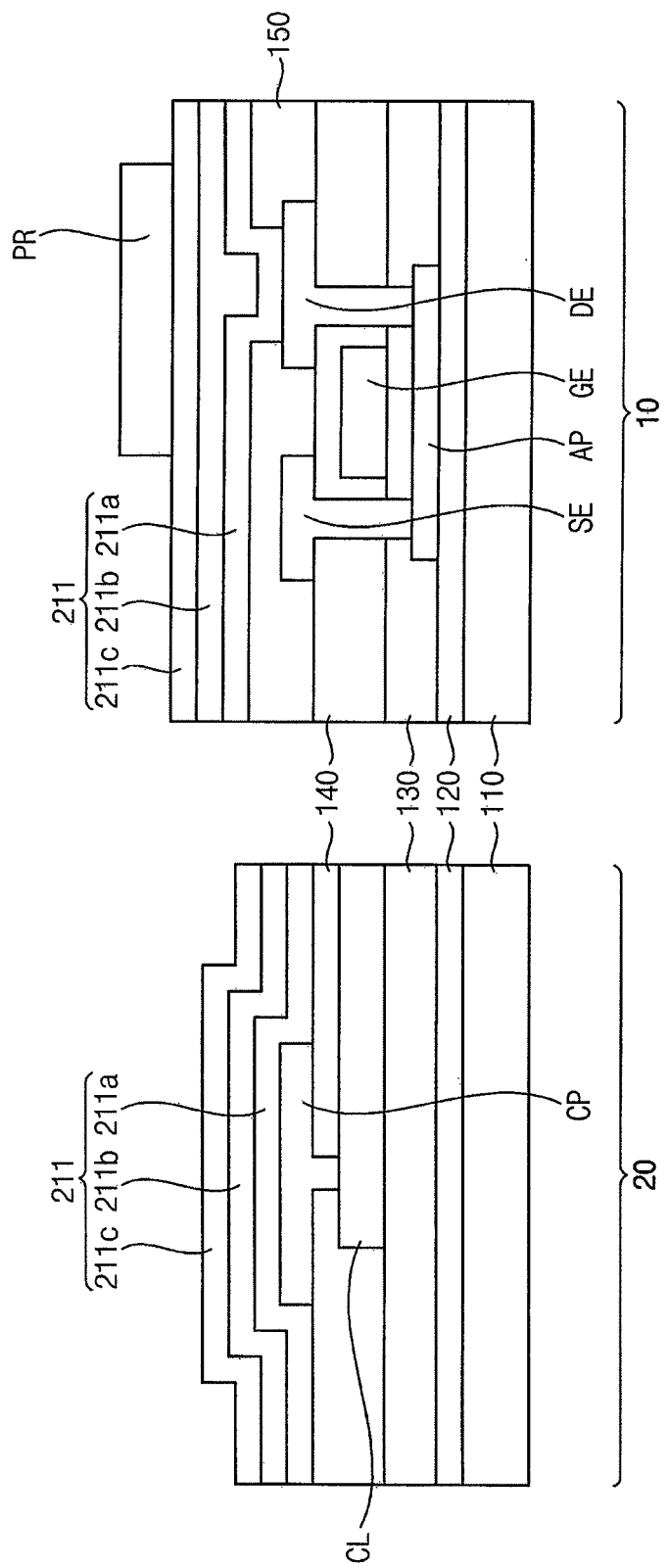

Referring to FIG. 6, a third insulation layer 150 may be formed to cover the source electrode SE and the drain electrode DE. In an exemplary embodiment, the connection pad CP may not be covered by the third insulation layer 150, and an entire upper surface of the connection pad CP may be exposed. The third insulation layer 150 may include an opening exposing at least a portion of the drain electrode DE.

The third insulation layer 150 may include, for example, an inorganic insulation material, an organic insulation material or a combination thereof. For example, the organic insulation material may include a phenol resin, an acryl resin, a polyimide resin, a polyamide resin, an epoxy resin, benzocyclobutene or the like.

A lower electrode layer 211 may be formed on the connection pad CP and the third insulation layer 150. The lower electrode layer 211 may include a metal, a metal alloy, a metal oxide or a combination thereof.

For example, the lower electrode layer 211 may have a multiple-layer structure including a metal oxide layer and a metal layer. The metal oxide layer may include indium oxide, zinc oxide, tin oxide, indium tin oxide, indium zinc oxide, zinc tin oxide or the like. The metal layer may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof.

In an exemplary embodiment, the lower electrode layer 211 may have a multiple-layer structure including a lower layer 211a, an intermediate layer 211b and an upper layer 211c. In an exemplary embodiment, the lower layer 211a and the upper layer 211c may include indium tin oxide, and the intermediate layer 211b may include silver.

The lower electrode layer 211 may contact the drain electrode DE through the opening of the third insulation layer 150. A photoresist pattern PR overlapping the drain electrode DE may be formed on the lower electrode layer 211.

Figure 7:
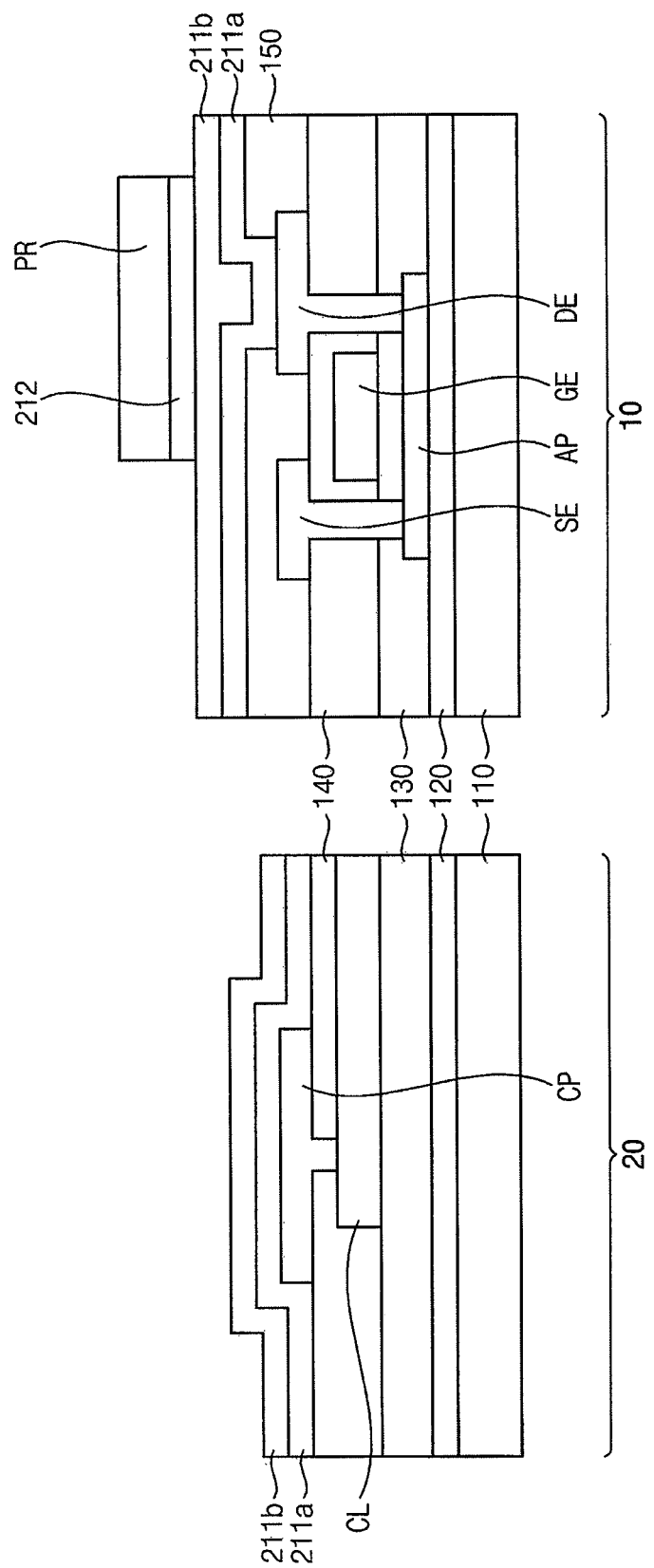

Referring to FIG. 7, the upper layer 211c of the lower electrode layer 211 may be etched. Thus, an upper pattern 212 may be formed under the photoresist pattern PR, and the remainder of the upper layer 211c may be removed to expose an upper surface of the intermediate layer 211b.

The upper layer 211c including indium tin oxide may be wet-etched using a first etching composition.

In an exemplary embodiment, the first etching composition may include nitric acid, a chlorinated compound, an ammonium compound, a cyclic amine compound and water.

Examples of the chlorinated compound may include sodium chloride, potassium chloride, ammonium chloride, or the like. These may be used each alone or in combination thereof.

Examples of the ammonium compound may include ammonium acetate, ammonium sulfamate, ammonium benzenediol, ammonium carbonate, ammonium dihydrogen phosphate, ammonium formate, ammonium bicarbonate, ammonium citrate, ammonium nitrate, ammonium persulfate, ammonium sulfamate, ammonium sulfate, or the like. These may be used each alone or in combination thereof.

Examples of the cyclic amine compound may include benzotriazole, 5-aminotetrazole, 3-aminotetrazole, 5-methyltetrazole, or the like. These may be used each alone or in combination thereof.

The first etching composition may include, for example, 3 wt % to 10 wt % of nitric acid, 0.01 wt % to 5 wt % of the chlorinated compound, 0.1 wt % to 5 wt % of the ammonium compound, 0.1 wt % to 5 wt % of the cyclic amine compound, and a remainder of water.

In an exemplary embodiment, the first etching composition may include nitric acid, sulfuric acid, an ammonium compound, a cyclic amine compound, and water. For example, the first etching composition may include 1 wt % to 10 wt % of nitric acid, 1 wt % to 10 wt % of sulfuric acid, 0.1 wt % to 5 wt % of the ammonium compound, 0.1 wt % to 5 wt % of the cyclic amine compound, and a remainder of water.

Figure 8:
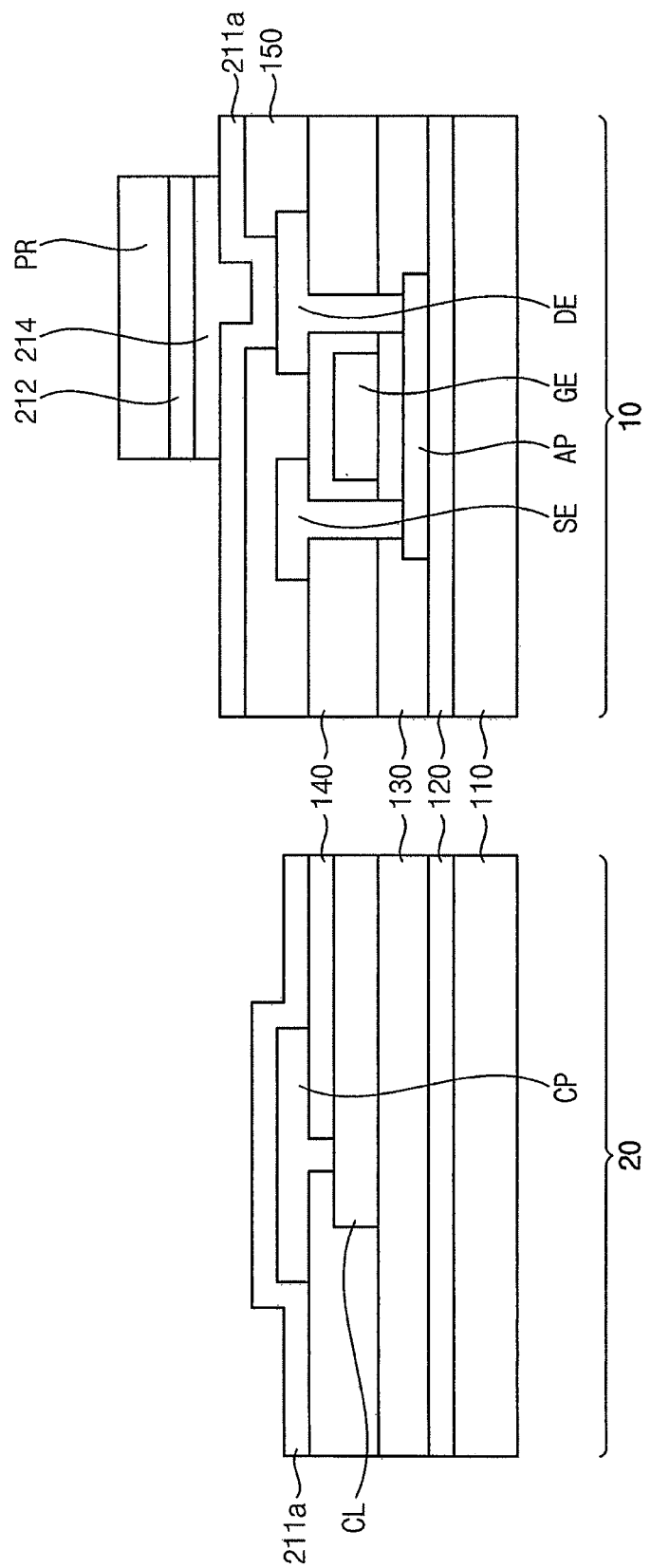

Referring to FIG. 8, the intermediate layer 211b of the lower electrode layer 211 may be etched. Thus, an intermediate pattern 214 may be formed under the upper pattern 212 and the photoresist pattern PR, and the remainder of the intermediate layer 211b may be removed to expose an upper surface of the lower layer 211c.

The intermediate layer 211b containing silver may be wet-etched using a second etching composition.

In an exemplary embodiment, the second etching composition may have a same composition as the previously explained etching composition for a silver-containing thin film. For example, the second etching composition may include an inorganic acid compound, a carboxylic acid compound, a sulfonic acid compound, a glycol compound, a nitrogen-containing dicarbonyl compound, a metal-based oxidizer, and water.

Figure 9:
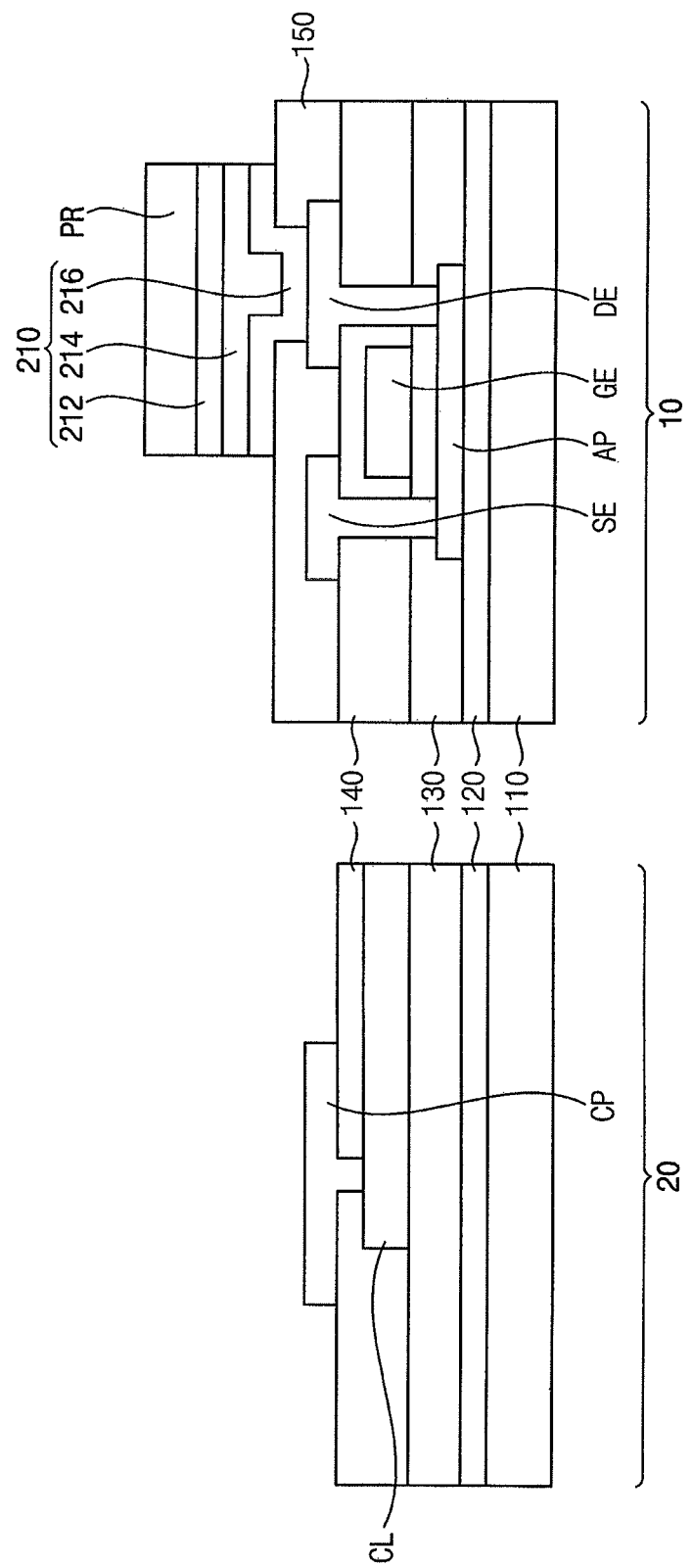

Referring to FIG. 9, the lower layer 211a of the lower electrode layer 211 may be etched. Thus, a lower electrode 210 including a lower pattern 216, the intermediate pattern 214 and the upper pattern 212 may be formed under the photoresist pattern PR. The lower pattern 216 may contact the drain electrode DE.

In an exemplary embodiment, the lower layer 211a including indium tin oxide may be wet-etched using a third etching composition. The third etching composition may have substantially a same composition as the first etching composition.

In an exemplary embodiment, the lower electrode 210 may be an anode of an organic light-emitting diode. The remainder of the lower layer 211a excluding the lower pattern 216 may be removed to expose the connection pad CP.

Figure 10:
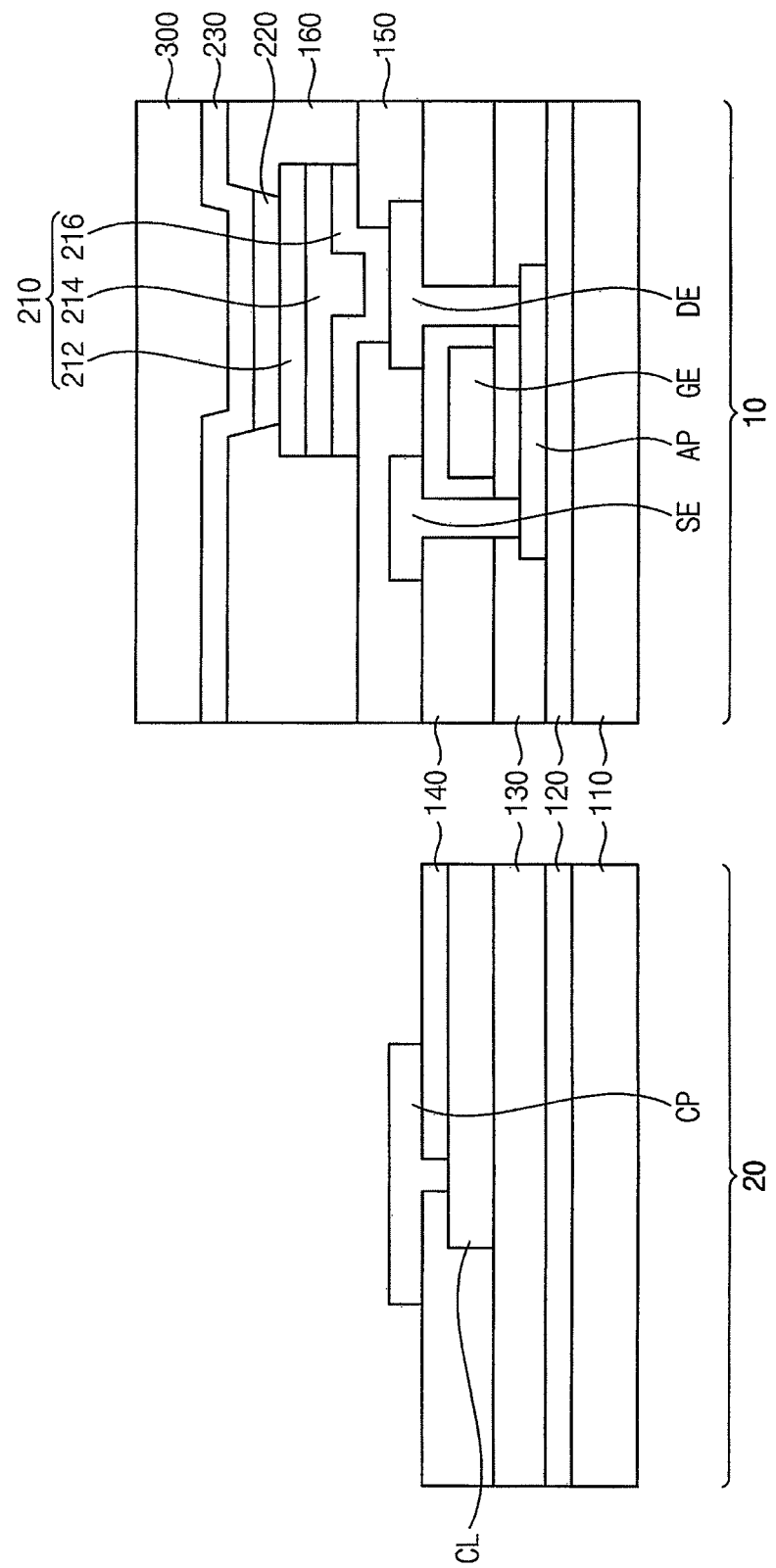

Referring to FIG. 10, a pixel-defining layer 160 may be formed on the third insulation layer 150. The pixel-defining layer 160 may include an opening that exposes at least a portion of the lower electrode 210. The pixel-defining layer 160 may include, for example, an organic insulation material.

An organic light-emitting layer 220 may be formed on the lower electrode 210. As an example, the organic light-emitting layer 220 may be disposed in the opening of the pixel-defining layer 160. In some implementations, the organic light-emitting layer 220 may extend over an upper surface of the pixel-defining layer 160, or may continuously extend over a plurality of the pixels in the display area 10.

The organic light-emitting layer 220 may include at least a light-emitting layer and may further include at least one of a hole-injection layer (HIL), a hole-transporting layer (HTL), an electron-transporting layer (ETL) and an electron-injection layer (EIL). The organic light-emitting layer 220 may include, for example, a low molecular weight organic compound or a high molecular weight organic compound.

In an exemplary embodiment, the organic light-emitting layer 220 may emit red light, green light or blue light. In some implementations, the organic light-emitting layer 220 may emit white light. The organic light-emitting layer 220 emitting white light may have a multiple-layer structure including a red-emitting layer, a green-emitting layer and a blue-emitting layer, or may have a single-layer structure including a mixture of a red-emitting material, a green-emitting material and a blue-emitting material.

An upper electrode 230 may be formed on the organic light-emitting layer 220. In an exemplary embodiment, the upper electrode 230 may continuously extend over a plurality of the pixels in the display area 10.

In an exemplary embodiment, the upper electrode 230 may function as a cathode. For example, the upper electrode 230 may be formed as a transmitting electrode or a reflecting electrode according to an emission type of the display device. When the upper electrode 230 is a transmitting electrode, the upper electrode 230 may include, for example, lithium (Li), calcium (Ca), lithium fluoride (LiF), aluminum (Al), magnesium (Mg), or a combination thereof. The display device may further include a sub electrode or a bus electrode line that includes indium tin oxide, indium zinc oxide, zinc tin oxide, indium oxide, zinc oxide, tin oxide or the like.

In an exemplary embodiment, a thin-film encapsulation layer 300 may be formed on the upper electrode 230. The thin-film encapsulation layer 300 may have a stack structure of an inorganic layer and an organic layer.

A capping layer and a blocking layer may be disposed between the upper electrode 230 and the thin-film encapsulation layer 300.

Figure 11:
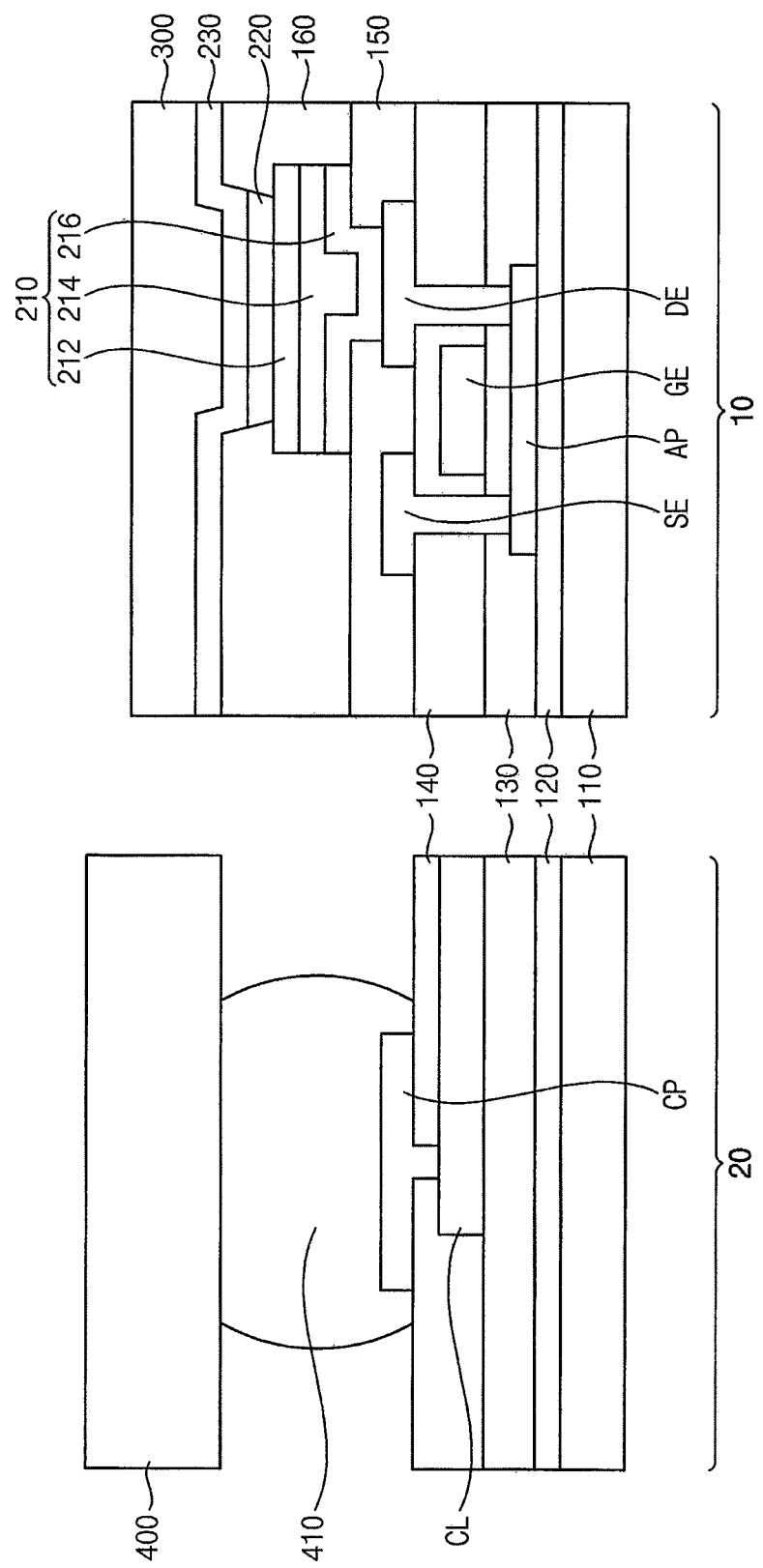
Figure 12:
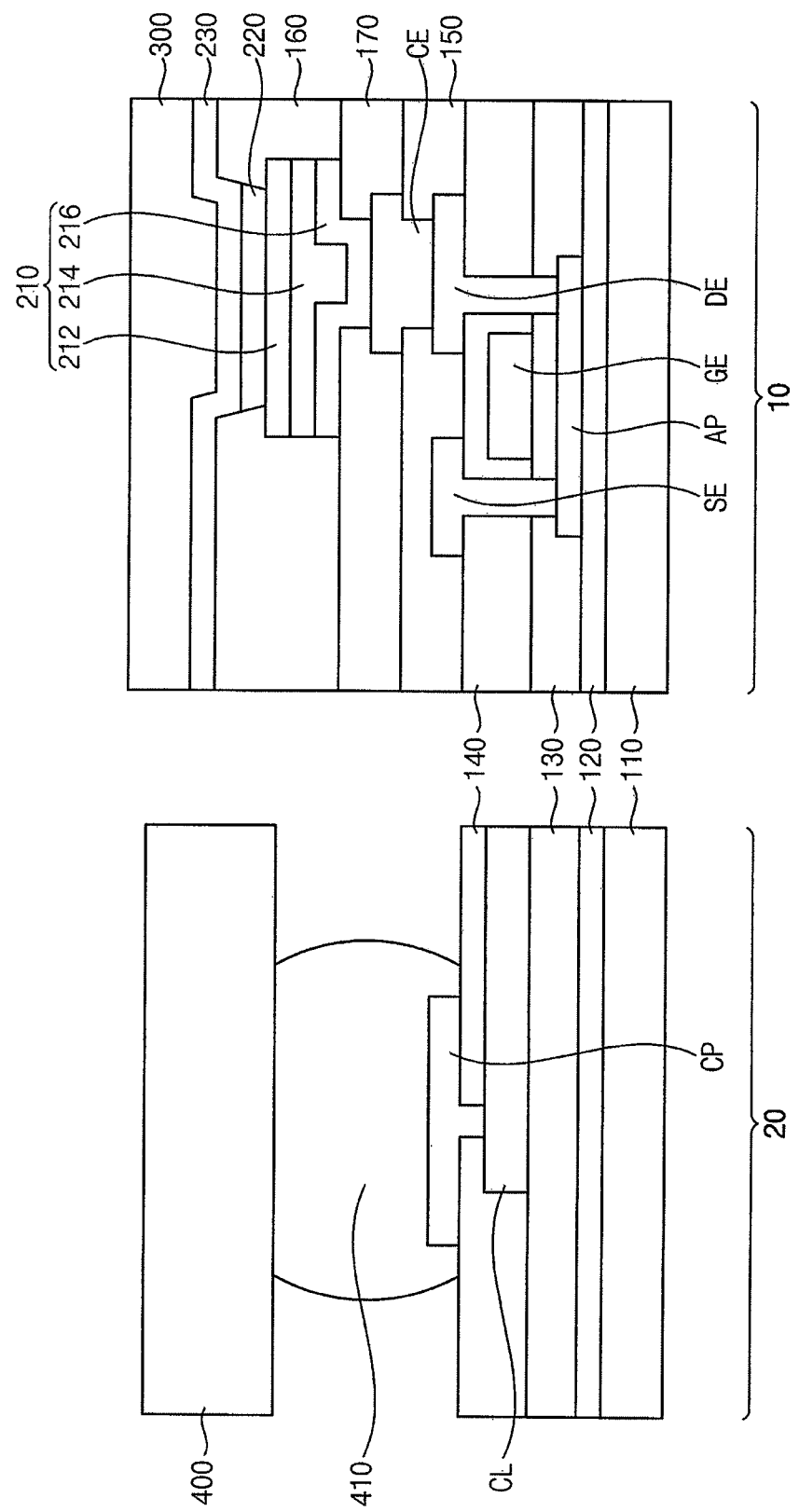
FIG. 12 illustrates a cross-sectional view of a display device manufactured according to an exemplary embodiment.

Referring to FIG. 11, the connection pad CP may be connected to a driving chip 400. For example, the connection pad CP may be connected to the driving chip 400 through a conductive bump 410.

As previously explained, in the process of etching the lower electrode layer, the connection pad CP formed in the periphery of the display device may be exposed without a passivation layer covering the connection pad CP. Thus, if a conventional etching composition including phosphoric acid were to be used, silver particles could be generated due to the exposed connection pad CP. The silver particles could be transferred to the lower electrode in the following processes including a stripping process, a rinsing process, or the like, thereby causing defects of the display device.

Etching compositions according to exemplary embodiments may have selectivity for a silver-containing thin film with respect to a metal oxide such as indium oxide. Damage to other metal layers including aluminum or the like, and reductive precipitation of silver particles may be minimized or prevented.

When etching a silver-containing thin film, the etching composition may prevent etching residues and may form a CD-skew having appropriate length.

Furthermore, the stability of the etching compositions for cumulative use and over time may be improved.

Thus, defects in manufacturing processes for a display device may be reduced, and the reliability of the display device may be improved.

In an exemplary embodiment, a lower electrode of an organic light-emitting diode may contact a drain electrode. In some implementations, as illustrated in FIG. 12, a lower electrode 210 of an organic light-emitting diode 200 may be electrically connected to a drain electrode DE through a connection electrode CE. The connection electrode CE may pass through a third insulation layer 150 to contact the drain electrode DE. A fourth insulation layer 170 may be disposed between the third insulation layer 150 and a pixel-defining layer 160, and the lower electrode 210 may pass through the fourth insulation layer 170 to contact the connection electrode CE.

In an exemplary embodiment, a connection pad CP disposed in the peripheral area 20 and electrically connected to a driving chip 400 through a conductive bump 410 may be formed from a same layer as the drain electrode DE. In some implementations, the connection pad CP may be formed from a same layer as the connection electrode CE.

Hereinafter, effects of exemplary embodiments will be explained with reference to experiments and examples.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES AND COMPARATIVE EXAMPLES

Etching compositions for Examples and Comparative Examples were prepared according to the following Tables 1 and 2. In Table 1, the unit of the content is wt % and the remainder of the etching compositions was water.

Table 1

|  | A1 | A2 | B | C | D | E1 | E2 | F | G |
|---|---|---|---|---|---|---|---|---|---|
| Example 1 | 23 | 23 | 3 | 9 | 15 | 4 | 4 | 1 | 0 |
| Example 2 | 20 | 20 | 3 | 9 | 15 | 4 | 4 | 1 | 0 |
| Example 3 | 25 | 25 | 3 | 9 | 15 | 4 | 4 | 1 | 0 |
| Example 4 | 23 | 23 | 1 | 9 | 15 | 4 | 4 | 1 | 0 |
| Example 5 | 23 | 23 | 4.9 | 9 | 15 | 4 | 4 | 1 | 0 |
| Example 6 | 23 | 23 | 3 | 8.1 | 15 | 4 | 4 | 1 | 0 |
| Example 7 | 23 | 23 | 3 | 9.9 | 15 | 4 | 4 | 1 | 0 |
| Example 8 | 23 | 23 | 3 | 9 | 10 | 4 | 4 | 1 | 0 |
| Example 9 | 23 | 23 | 3 | 9 | 20 | 4 | 4 | 1 | 0 |
| Example 10 | 23 | 23 | 3 | 9 | 15 | 1 | 1 | 1 | 0 |
| Example 11 | 23 | 23 | 3 | 9 | 15 | 5 | 5 | 1 | 0 |
| Example 12 | 23 | 23 | 3 | 9 | 15 | 4 | 4 | 0.1 | 0 |
| Example 13 | 23 | 23 | 3 | 9 | 15 | 4 | 4 | 2 | 0 |
| Comparative Example 1 | 19 | 19 | 3 | 9 | 15 | 4 | 4 | 1 | 0 |
| Comparative Example 2 | 26 | 26 | 3 | 9 | 15 | 4 | 4 | 1 | 0 |
| Comparative Example 3 | 23 | 23 | 0.5 | 9 | 15 | 4 | 4 | 1 | 0 |
| Comparative Example 4 | 23 | 23 | 5.5 | 9 | 15 | 4 | 4 | 1 | 0 |
| Comparative Example 5 | 23 | 23 | 3 | 7.5 | 15 | 4 | 4 | 1 | 0 |
| Comparative Example 6 | 23 | 23 | 3 | 10.5 | 15 | 4 | 4 | 1 | 0 |
| Comparative Example 7 | 23 | 23 | 3 | 9 | 9 | 4 | 4 | 1 | 0 |
| Comparative Example 8 | 23 | 23 | 3 | 9 | 21 | 4 | 4 | 1 | 0 |
| Comparative Example 9 | 23 | 23 | 3 | 9 | 15 | 0.5 | 0.5 | 1 | 0 |
| Comparative Example 10 | 23 | 23 | 3 | 9 | 15 | 6 | 6 | 1 | 0 |
| Comparative Example 11 | 23 | 23 | 3 | 9 | 15 | 4 | 4 | 0 | 0 |
| Comparative Example 12 | 23 | 23 | 3 | 9 | 15 | 4 | 4 | 3 | 0 |
| Comparative Example 13 | 23 | 23 | 3 | 9 | 15 | 4 | 4 | 1 | 1 |

TABLE 2

| Component | Name of component |
|---|---|
| A1 | Acetic acid |
| A2 | Citric acid |
| B | Methanesulfonic acid |
| C | Nitric acid |
| D | Glycolic acid |
| E1 | Imidazolidin-2,4-dione |
| E2 | Pyro-glutamic acid |
| F | Iron nitrate |
| G | Phosphoric acid |

Experiment 1—Evaluation of Etching Characteristics

A triple layer of ITO/Ag/ITO was formed on a glass substrate with a thickness of 70 Å/1,000 Å/50 Å, and a photoresist pattern was formed on the triple layer.

The ITO layers in each sample including the triple layer were etched by a conventional etching composition including nitric acid and sulfuric acid. The Ag layers were etched by the etching compositions according to Examples 1 to 13 and Comparative Examples 1 to 13. An etching ratio and a CD-skew, defined as a distance between an edge of the photoresist pattern and an edge of the Ag layer, were measured and represented in the following Table 3. In order to evaluate etching residue and precipitation, after a lower electrode for an organic light-emitting diode was formed according to the method illustrated in FIGS. 2 to 9, the appearance of etching residue and precipitation on a surface of a connection pad formed from a triple layer of Ti/Al/Ti were observed.

TABLE 3

| | Etching ratio (Å/sec) | CD-skew (at side, μm) | Etching residue | precipitation | note |
|---|---|---|---|---|---|
| Example 1 | 382 | 0.337 | X | X | — |
| Example 2 | 380 | 0.310 | X | X | — |
| Example 3 | 420 | 0.340 | X | X | — |
| Example 4 | 384 | 0.304 | X | X | — |
| Example 5 | 416 | 0.357 | X | X | — |
| Example 6 | 370 | 0.317 | X | X | — |
| Example 7 | 434 | 0.350 | X | X | — |
| Example 8 | 386 | 0.313 | X | X | — |
| Example 9 | 400 | 0.347 | X | X | — |
| Example 10 | 400 | 0.353 | X | X | — |
| Example 11 | 372 | 0.350 | X | X | — |
| Example 12 | 382 | 0.314 | X | X | — |
| Example 13 | 434 | 0.330 | X | X | — |
| Comparative Example 1 | 280 | 0.274 | O | X | — |
| Comparative Example 2 | 530 | 0.314 | X | X | Damage of photoresist pattern |
| Comparative Example 3 | 285 | 0.270 | O | X | — |
| Comparative Example 4 | 526 | 0.370 | X | X | — |
| Comparative Example 5 | 250 | 0.281 | O | X | — |
| Comparative Example 6 | 666 | 0.380 | X | X | — |
| Comparative Example 7 | 282 | 0.238 | O | X | — |
| Comparative Example 8 | 532 | 0.377 | X | X | — |
| Comparative Example 9 | 668 | 0.370 | X | X | — |
| Comparative Example 10 | 252 | 0.281 | O | X | — |
| Comparative Example 11 | 287 | 0.264 | O | X | — |
| Comparative Example 12 | 528 | 0.400 | X | X | — |
| Comparative Example 13 | 395 | 0.330 | X | O | — |

Referring to Table 3, when the etching compositions of Examples 1 to 13 were used, etching residue and precipitation did not appear, and the etching ratios and the CD-skews as were found to be within appropriate ranges, which are respectively about 300 to 500 Å/sec and about 0.3 to 0.35 μm.

However, when the etching compositions of Comparative Examples 1, 3, 5, 7, 10 and 11 were used, an etching residue appeared. When the etching compositions of Comparative Examples 2, 4, 6, 8, 9 and 12 were used, the etching ratios and the CD-skews were not within the appropriate ranges. When the etching composition of Comparative Example 13 including phosphoric acid was used, precipitation of silver particles appeared.

Thus, it can be observed that excessively small amounts of the carboxylic acid compound, the sulfonic acid compound, the nitric acid, the glycol compound and the metal-based oxidizer or excessively large amount of the nitrogen-containing dicarbonyl compound may cause etching residue, and that excessively large amounts of the carboxylic acid compound, the sulfonic acid compound, the nitric acid, the glycol compound and the metal-based oxidizer or excessively small amount of the nitrogen-containing dicarbonyl compound may cause an excessive increase of CD-skew.

Furthermore, it can be noted that phosphoric acid may increase precipitation of particles.

Experiment 2—Evaluation of Reliability for Cumulative Use

A reference etching was performed by using the etching composition of Example 1, and test etchings were performed with added silver powder. The obtained results were represented in the following Table 4. In Table 4, "O" represents that the amount of change to the reference etching is within 10%, and "X" represents that the amount of change to the reference etching is above 10%.

TABLE 4

| Content of silver powder | Etching ratio (Å/sec) | CD-skew (at side, μm) | Etching residue | precipitation |
|---|---|---|---|---|
| Ref | O | O | O | O |
| 300 ppm | O | O | O | O |
| 500 ppm | O | O | O | O |
| 700 ppm | O | O | O | O |
| 900 ppm | O | X | X | O |

Referring to Table 4, the change of etching characteristics was not large even when the content of silver ions was increased in the etching composition of Example 1.

Experiment 3—Evaluation of Reliability Over Time

A reference etching was performed by using the etching composition of Example 1, and test etchings were performed over time. The obtained results were represented in the following Table 5. In Table 5, "O" represents that the amount of change to the reference etching is within 10%, and "X" represents that the amount of change to the reference etching is above 10%.

TABLE 5

| Time | Etching ratio (Å/sec) | CD-skew (at side, μm) | Etching residue | precipitation |
|---|---|---|---|---|
| Ref | O | O | O | O |
| 2 hour | O | O | O | O |
| 4 hour | O | O | O | O |
| 6 hour | O | O | O | O |
| 8 hour | O | O | O | O |
| 10 hour | O | O | O | O |
| 12 hour | O | O | O | O |

Referring to Table 5, a change of etching characteristics for the etching composition of Example 1 over time was not large.

Thus, it can be noted that the etching compositions according to exemplary embodiments has a higher reliability.

By way of summation and review, a reflective electrode of the organic light-emitting display device may include silver (Ag). A silver-containing thin film may be etched by wet etching.

When a silver-containing thin film is etched by an etching composition, there is a possibility that silver ions could be dissolved in the etching composition. The silver ions dissolved in the etching composition could adsorb to other metal patterns thereby forming a silver particle. The silver particle could be transferred to the reflective electrode in other processes thereby causing defects or failure in manufacturing processes.

Embodiments provide an etching composition for a silver-containing thin film, a method for forming a pattern using the etching composition, and a method for manufacturing a display device using the etching composition.

Etching compositions according to embodiments may have selectivity for a silver-containing thin film with respect to a metal oxide such as indium oxide. Damage to other metal layers including aluminum or the like and reductive precipitation of silver particles may be prevented In addition, when etching a silver-containing thin film, the etching composition may prevent etching residues and may form a CD-skew having appropriate length.

Defects in manufacturing processes for a display device may be reduced, and the reliability of the display device may be improved Also, the stability of the etching compositions for cumulative use and over time may be improved.

The etching composition according to exemplary embodiments may be used for etching a silver-containing thin film or a multiple layer structure including the silver-containing thin film. For example, the etching composition according to exemplary embodiments may be used for forming wirings or electrodes, or for manufacturing various electronic devices including the wirings or the electrodes.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An etching composition for a silver-containing thin film, the etching composition comprising:
    8.1 wt % to 9.9 wt % of an inorganic acid compound,
    40 wt % to 50 wt % of a carboxylic acid compound,
    1 wt % to 4.9 wt % of a sulfonic acid compound,
    10 wt % to 20 wt % of a glycol compound,
    2 wt % to 10 wt % of a nitrogen-containing dicarbonyl compound,
    0.1 wt % to 2 wt % of a metal-based oxidizer, and
    water, wherein
    the nitrogen-containing dicarbonyl compound includes imidazolidine-2,4-dione and pyro-glutamic acid.

2. The etching composition as claimed in claim 1, wherein the inorganic acid compound includes at least one selected from nitric acid ($HNO_3$), sulfuric acid ($H_2SO_4$) and hydrochloric acid (HCl).

3. The etching composition as claimed in claim 1, wherein the carboxylic acid compound includes at least one selected from acetic acid ($CH_3CO_2H$), malic acid ($C_4H_6O_5$), citric acid ($C_6H_8O_7$), tartaric acid ($C_4H_6O_6$), lactic acid ($C_3H_6O_3$), formic acid ($CH_2O_2$), succinic acid ($C_4H_6O_4$) and fumaric acid ($C_4H_4O_4$).

4. The etching composition as claimed in claim 1, wherein the sulfonic acid compound includes at least one selected from methanesulfonic acid ($CH_3SO_3H$), p-toluenesulfonic acid ($CH_3C_6H_4SO_3H$), benzenesulfonic acid ($C_6H_5SO_3H$), amino methylsulfonic acid ($CH_5NO_3S$) and sulfamic acid ($H_3NSO_3$).

5. The etching composition as claimed in claim 1, wherein the glycol compound includes at least one selected from diethylene glycol ($C_4H_{10}O_3$), ethylene glycol ($HOCH_2CH_2OH$), glycolic acid ($CH_2OHCOOH$), propylene glycol ($C_3H_9O_2$) and triethylene glycol ($C_6H_{14}O_4$).

6. The etching composition as claimed in claim 1, wherein the nitrogen-containing dicarbonyl compound further includes at least one selected from iminodiacetic acid ($C_4H_7NO_4$), succinimide ($C_4H_5NO_2$), glutarimide ($C_5H_7NO_2$), asparagine ($C_4H_8N_2O_3$), glutamic acid ($C_5H_9NO_4$), aspartic acid ($C_4H_7NO_4$), and hippuric acid ($C_9H_9NO_3$).

7. The etching composition as claimed in claim 1, wherein the metal-based oxidizer includes at least one selected from copper sulfate ($CuSO_4$), copper nitrate ($Cu(NO_3)_2$), ferric nitrate ($Fe(NO_3)_3$), ferric sulfate ($Fe_2(SO_4)_3$), magnesium nitrate ($Mg(NO_3)_2$) and magnesium sulfate ($MgSO_4$).

8. The etching composition as claimed in claim 1, wherein:
    the inorganic acid compound includes nitric acid,
    the carboxylic acid compound includes acetic acid and citric acid,
    the sulfonic acid compound includes methanesulfonic acid,
    the glycol compound includes glycolic acid, and
    the metal-based oxidizer includes ferric nitrate.

9. The etching composition as claimed in claim 1, wherein the nitrogen-containing dicarbonyl compound includes imidazolidine-2,4-dione and pyro-glutamic acid with a weight ratio of 1:1.

10. A method for forming a pattern, the method comprising:
    forming a multiple layer structure including a silver-containing thin film and a metal oxide thin film;
    etching the metal oxide thin film using a first etching composition; and
    etching the silver-containing thin film using a second etching composition, the second etching composition including:
        8.1 wt % to 9.9 wt % of an inorganic acid compound,
        40 wt % to 50 wt % of a carboxylic acid compound,
        1 wt % to 4.9 wt % of a sulfonic acid compound,
        10 wt % to 20 wt % of a glycol compound,
        2 wt % to 10 wt % of a nitrogen-containing dicarbonyl compound,
        0.1 wt % to 2 wt % of a metal-based oxidizer, and
        water, wherein
    the nitrogen-containing dicarbonyl compound includes imidazolidine-2,4-dione and pyro-glutamic acid.

11. The method as claimed in claim 10, wherein:
    the inorganic acid compound includes nitric acid,
    the carboxylic acid compound includes acetic acid and citric acid,
    the sulfonic acid compound includes methanesulfonic acid,
    the glycol compound includes glycolic acid, and
    the metal-based oxidizer includes ferric nitrate.

12. The method as claimed in claim 10, wherein the first etching composition includes:
    nitric acid,
    sulfuric acid,
    an ammonium compound,
    a cyclic amine compound, and
    water.

13. A method for manufacturing a display device, the method comprising:
- forming an active pattern on a base substrate in a display area;
- forming a gate metal pattern including a gate electrode overlapping the active pattern;
- forming a source metal pattern including a connection pad, the connection pad being in a peripheral area surrounding the display area;
- forming a multiple layer structure on the source metal pattern, the multiple layer structure including a lower layer including a metal oxide, an intermediate layer on the lower layer, the intermediate layer including silver or a silver alloy, and an upper layer on the intermediate layer, the upper layer including a metal oxide;
- etching the upper layer using a first etching composition;
- etching the intermediate layer using a second etching composition comprising:
  - 8.1 wt % to 9.9 wt % of an inorganic acid compound,
  - 40 wt % to 50 wt % of a carboxylic acid compound,
  - 1 wt % to 4.9 wt % of a sulfonic acid compound,
  - 10 wt % to 20 wt % of a glycol compound,
  - 2 wt % to 10 wt % of a nitrogen-containing dicarbonyl compound,
  - 0.1 wt % to 2 wt % of a metal-based oxidizer, and water; and
- etching the lower layer using a third etching composition to form an electrode pattern in the display area and to expose the connection pad, wherein the nitrogen-containing dicarbonyl compound includes imidazolidine-2,4-dione and pyro-glutamic acid.

14. The method as claimed in claim 13, wherein the source metal pattern has a single-layer structure or a multiple-layer structure and includes aluminum.

15. The method as claimed in claim 13, wherein the metal oxide includes at least one selected from indium oxide, zinc oxide, tin oxide, indium tin oxide and indium zinc oxide.

16. The method as claimed in claim 13, wherein the source metal pattern further includes a source electrode and a drain electrode, which respectively contact the active pattern.

17. The method as claimed in claim 13, further comprising connecting a driving chip that generates a driving signal to the connection pad.

* * * * *